(12) United States Patent
Saitou

(10) Patent No.: US 7,714,621 B2
(45) Date of Patent: May 11, 2010

(54) INPUT SIGNAL DETECTING CIRCUIT

(75) Inventor: Norihiro Saitou, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/073,034

(22) Filed: Feb. 28, 2008

(65) Prior Publication Data
US 2008/0218238 A1 Sep. 11, 2008

(30) Foreign Application Priority Data
Mar. 7, 2007 (JP) ............................. 2007-057315

(51) Int. Cl.
*H03K 5/22* (2006.01)
(52) U.S. Cl. ........................... 327/64; 327/65; 327/307
(58) Field of Classification Search ............. 327/62–65, 327/307, 563, 512–513; 330/69
See application file for complete search history.

(56) References Cited

U.S. PATENT DOCUMENTS 6,194,965 B1 * 2/2001 Kruczkowski et al. ...... 327/307

6,486,710 B1 * 11/2002 Simoni ..................... 327/63
2004/0251965 A1 12/2004 Ueda et al.
2006/0033535 A1 2/2006 Ishizuka et al.

FOREIGN PATENT DOCUMENTS

JP 2006-54742 2/2006

OTHER PUBLICATIONS

European Search Report dated Aug. 10, 2009.

* cited by examiner

*Primary Examiner*—Long Nguyen
(74) *Attorney, Agent, or Firm*—McGinn IP Law Group, PLLC

(57) ABSTRACT

An input signal detecting circuit includes a plurality of comparators configured to output a plurality of differential output signals in response to a differential input signal, respectively; and a differential exclusive OR circuit configured to output an exclusive OR resultant signal from the plurality of differential output signals outputted from the plurality of comparators. In at least one of the plurality of comparators, a DC operation voltage is changed in response to a control signal supplied to the comparator.

20 Claims, 8 Drawing Sheets

INPUT SIGNAL DETECTING CIRCUIT

BACKGROUND OF THE INVENTION

1. Field of the Invention

The present invention relates to an input signal detecting circuit for detecting a differential signal. This Patent application is based on Japanese Patent application No. 2007-057315. The disclosure thereof is incorporated herein by reference.

2. Description of Related Art

In recent years, data transfer between computers has been changed from a parallel transfer to a serial transfer in which transfer speed is fast. A circuit for recognizing reception of a signal when the signal is transmitted and received (hereinafter, to be referred to as an input signal detecting circuit) is standardized in the physical layers in many interfaces such as USB (Universal Serial Bus), PCI-Express (Peripheral Component Interconnect), SATA (Serial AT Attachment), and SAS (Serial Attached Small Computer System Interface). Also, each of the standards defines a value of the input signal amplitude. In order that such standardized circuits operate normally, it is important that an input signal has an amplitude within a range in the standard, independently of the use environment of the circuit.

One of the especially important factors in the environment under which a circuit is used is a temperature. Typically, in many cases, an interface unit uses an analog circuit, and an analog circuit uses a differential comparing circuit. Also, the differential comparing circuit uses elements such as transistors and resistors. The transistor has a transfer conductance [S] (hereinafter, to be referred to as gm), and a voltage amplification factor of the differential comparing circuit is determined based on a load resistance and gm. When the thickness of a gate oxide film of the transistor is represented as $T_{ox}$, a dielectric constant of the gate oxide film is represented as $\varepsilon_{ox}$, the vacuum dielectric constant is represented as $\varepsilon_o$, and a mobility of a carrier is represented as $\mu$, a capacitance $C_{ox}$ of the gate oxide film is represented by the following equation (1).

$$C_{ox} = \frac{\varepsilon_{ox}\varepsilon_o}{T_{ox}} \quad (1)$$

Also, when a product of the capacitance $C_{ox}$ of the gate oxide film and the carrier mobility $\mu$ is represented as $\beta$ and a current flowing between the drain and the source in the transistor is represented as $I_{ds}$, a gate width of the transistor is represented as W, and a gate length of the transistor is represented as L, the transfer conductance gm can be represented by the following equation (2).

$$gm = \sqrt{2 \times \beta \times I_{ds} \times W \times L} \quad (2)$$

With reference to the equation (2), the transfer conductance gm varies in accordance with the temperature because the product $\beta$ and the current $I_{ds}$ are included. Such variation of gm dependent on temperature has influence on the output amplitude of the differential comparing circuit. That is, the output amplitude of the differential comparing circuit is increased or decreased on the basis of the temperature. The input signal detecting circuit to which the differential comparing circuit is applied has a temperature condition under which the input signal within the range of the standard cannot be detected.

One conventional example of the input signal detecting circuit is Japanese Patent Application Publication (JP-P2006-054742A: first conventional example). FIG. 1 shows the configuration of the input signal detecting circuit disclosed in the first conventional example. With reference to FIG. 1, the conventional input signal detecting circuit includes differential comparing circuits CMP7 and CMP8 and an exclusive OR EOR3. Hereinafter, an N-channel MOS (Metal Oxide Semiconductor) transistor and a P-channel MOS transistor are referred to as an NMOS transistor and a PMOS transistor, respectively. The differential comparing circuit CMP7 includes NMOS transistors Mn9 and Mn10 as a differential pair, resistors R9 and R10 serving as load resistances, and a constant current source Ib7. One end of the constant current source Ib7 is connected to the sources of the NMOS transistors Mn9 and Mn10, and one end of the resistor R9 is connected to the drain of the NMOS transistor Mn9, and one end of the resistor R10 is connected to the drain of the NMOS transistor Mn10. The other end of the resistor R9 and the other end of the resistor R10 are connected to a power supply voltage VDD. The other end of the constant current source Ib7 is grounded. The differential comparing circuit CMP8 includes NMOS transistors Mn11 and Mn12 as a differential pair, resistors R11 and R12 serving as load resistances, a resistor Rb1 to supply an offset voltage Voff1, and a constant current source Ib8. One end of the constant current source Ib8 is connected to the sources of the NMOS transistors Mn11 and Mn12, and one end of the resistor R11 is connected to the drain of the NMOS transistor Mn11, and one end of the resistor R12 is connected to the drain of the NMOS transistor Mn12. The other end of the resistor R11 and the other end of the resistor R12 are connected to one end of the resistor Rb1, and the other end of the resistor Rb1 is connected to the power supply voltage VDD. The other end of the constant current source Ib8 is grounded.

The gates of the NMOS transistors Mn9 and Mn11 are connected to an input terminal to which an input signal SINP is supplied, and the gates of the NMOS transistors Mn10 and Mn12 are connected to an input terminal to which an input signal SINN is supplied. The NMOS transistor Mn9 is connected to the resistor R9 through a node N9. The NMOS transistor Mn10 is connected to the resistor R10 through a node N10. The NMOS transistor Mn11 is connected to the resistor R11 through a node N11. The NMOS transistor Mn12 is connected to the resistor R12 through a node N12. A differential output signal CMP7out, which is composed of an output signal CMP7outP as a positive (normal) phase signal and an output signal CMP7outN as a negative (opposite) phase signal, is outputted from the nodes N9 and N10. A differential output signal CMP8out, which is composed of an output signal CMP8outP as a positive (normal) phase signal and an output signal CMP8outN as a negative (opposite) phase signal, is outputted from the nodes N11 and N12. The exclusive OR EOR3 is connected to the nodes N9 to N12 and outputs a signal of an exclusive OR result between the differential output signal CMP7out and the differential output signal CMP8out (an output signal Sout (binary signals Sout3P and Sout3N)).

FIGS. 2A, 2B and 2C are timing charts of the operation signals at nodes in the input signal detecting circuit according to the conventional example. With reference to FIG. 2A, a differential input signal SIN is composed of the input signal SINP as the positive phase signal, and the input signal SINN as the negative phase signal, and is supplied to the input signal detecting circuit. It is supposed that the detection of the differential input signal SIN is not required between a time t1 and a time t5, and the detection of the differential input signal SIN is required between the time t5 and a time t9. The input signal SINP is supplied to the NMOS transistors Mn9 and Mn11, and the input signal SINN is supplied to the NMOS transistors Mn10 and Mn12. When a load resistance of the differential comparing circuit is assumed to be RL and a voltage (amplitude) of the input signal to the differential comparing circuit is assumed to be $V_{in}$, a voltage (amplitude) $V_o$ of the output signal from the differential comparing circuit is represented by the following equation (3).

$$V_o = gm \times RL \times V_{in} \tag{3}$$

Here, the voltages of the input signals SINP and SINN are assumed to be SINP and SINN, respectively, the voltages of the output signals CMP7outP, CMP7outN, CMP8outP and CMP8outN are assumed to be CMP7outP, CMP7outN, CMP8outP and CMP8outN, respectively, and the resistances of the resistors R9, R10, R11 and R12 as the load resistances are assumed to be R9, R10, R11 and R12, respectively. At this time, the equation (3) is represented by the following equations (4) and (5).

$$CMP7\text{out}P - CMP7\text{out}N = rm \times R9 \times (SINP - SINN) \tag{4}$$

$$CMP8\text{out}P - CMP8\text{out}N = rm \times R11 \times (SINP - SINN) \tag{5}$$

Here, R9=R10 and R11=R12.

As shown by the equations (4) and (5), the input signal SIN (SINP−SINN) is amplified for the values of gm×R9 and gm×R11 as the voltage amplification factors of the differential comparing circuits CMP7 and CMP8 and is outputted as the differential output signals CMP7out (CMP7outP−CMP7outN) and CMP8out (CMP8outP−CMP8outN) of the differential comparing circuits CMP7 and CMP8 (refer to FIG. 2B).

DC operation voltages Vo7P and Vo7N of the output signals CMP7outP and CMP7outN of the differential comparing circuit CMP7 are determined from the following equations (6) and (7) by using the power supply voltage VDD, the resistors R9 and R10 and the constant current source Ib7 (a current value Ib7).

$$V_o 7P = VDD - \frac{R10 \times Id7}{2} \tag{6}$$

$$V_o 7N = VDD - \frac{R9 \times Id7}{2} \tag{7}$$

On the other hand, DC operation voltages Vo8P and Vo8N of the output signals CMP8outP and CMP8outN of the differential comparing circuit CMP8 are calculated by using the power supply voltage VDD and the resistors Rb1 (the resistance value Rb1), R11 and R12. When the power supply voltage VDD, the resistors R9 and R10, R11 and R12, and the constant current sources Ib7 and Ib8 are the same power source, the same resistor and the same current source, the DC operation voltages Vo8P and Vo8N and the DC operation voltages Vo7P and Vo7N are separated by an offset voltage off1 indicated in the following equation (8).

$$V\text{off1} = R_{b1} \times I_{b8} \tag{8}$$

Under this environment, the amplitude (SINP−SINN) of the differential input signal SIN is small between the time t1 and the time t5. As a result, the differential output signal CMP7out of the differential comparing circuit CMP7 and the differential output signal CMP8out of the differential comparing circuit CMP8 do not cross. On the other hand, since the amplitude of the differential input signal SIN is great between the time t5 and the time t9, the differential output signal CMP7out and the differential output signal CMP8out cross.

The exclusive OR EOR3 compares the output signal CMP7outP and the output signal CMP8outN, and determines to be a logic level "1", if the output signal CMP7outP is higher in voltage than the output signal CMP8outN, and determines to be a logic level "0" if the output signal CMP7outP is lower than the output signal CMP8outN. At the same time, the exclusive OR EOR3 compares the output signal CMP7outN and the output signal CMP8outP, and determines to be the logic level "1" if the output signal CMP8outP is higher in voltage than the output signal CMP7outN, and determines to be the logic level "0" if the output signal CMP8outP is lower in voltage than the output signal CMP7outN.

With reference to FIG. 2C, with the relation between the output signals Sout3P and Sout3N of the exclusive OR EOR3, when these two logic levels are all "1" or "0", the output signal Sout3N is higher in voltage than the output signal Sout3P (a logic level "1"). On the contrary, when the two logic levels are different, the output signal Sout3N of the exclusive OR EOR3 is lower in voltage than the output signal Sout3P (a logic level "0"). In this way, when the differential input signal SIN having an amplitude to be detected is supplied, the logic level "0" is outputted as the output signal Sout. As mentioned above, the input signal detecting circuit according to the conventional examples can detect the differential input signal SIN so that the differential output signals CMP7out and CMP8out having amplitudes equal to or higher than the offset voltage Voff1 are obtained. That is, a threshold voltage (hereinafter, to be referred to as a detection threshold voltage) of the differential input signal SIN is set in accordance with the offset voltage Voff1 determined by the equation (8) such that the differential input signal SIN can be detected by the input signal detecting circuit according to the conventional example.

As shown in the equations (4) and (5), the amplitudes of the differential output signals CMP7out and CMP8out are determined in accordance with the transfer conductance gm whose value varies dependently on temperature. For this reason, even when the detectable differential input signal SIN, (having the amplitude equal to or higher than the detection threshold voltage is supplied, there would be a case that the differential output signals CMP7out and CMP8out having the correct amplitude cannot be outputted due to the influence of a peripheral temperature.

The equations (4) and (5) described in the operation of the above conventional circuit indicate a relation between the input and output of the differential comparing circuit. The voltage amplification factor of the typical voltage amplifying circuit is defined as (output voltage)/(input voltage)=voltage amplification factor=gm×RL, where RL is the load resistance. When this is applied to the differential comparing circuits CMP7 and CMP8 of the input signal detecting circuit according to the conventional example, the following equations (9) and (10) are obtained.

$$\frac{(CMP7\text{out}P - CMP7\text{out}N)}{SINP - SINN} = gm \times R9 \tag{9}$$

$$\frac{(CMP8\text{out}P - CMP8\text{out}N)}{SINP - SINN} = gm \times R11 \tag{10}$$

As shown in the equation (2), the temperature variation in the transfer conductance gm results from the current flowing through the transistor and the product β of the capacitance $C_{ox}$ of the gate oxide film and the carrier mobility μ. In particular, a temperature variation amount of the transfer conductance gm dependent on the temperature variation in the carrier mobility μ is great, which causes a severe variation in the voltage amplification factor represented by the equations (9) and (10). On the other hand, when the offset voltage Voff1 is assumed to be stable for the temperature, the detection threshold voltage of the differential input signal SIN can be also assumed to be stable.

FIGS. 3A and 3B are diagrams showing the waveforms of the differential output signals 7out and 8out when the differential input signal SIN having an amplitude of the detection threshold voltage or more is supplied to the input signal detecting circuit according to the conventional example. FIGS. 3A and 3B show the waveforms when the peripheral temperature is −25° C. and 75° C. With reference to FIGS. 3A and 3B, even when the peripheral temperature varies from −25° C. to 75° C., the DC operation voltages Vo7P (Vo7N) and Vo8P (Vo8N) in the differential comparing circuits CMP7 and CM8 are 800 mV and 760 mV, respectively, and they does not almost vary. That is, the offset voltage is 40 mV, which is constant independently of the temperature. On the other hand, although the amplitudes of the differential output signals CMP7out and CMP8out are 50 mV at the temperature of −25° C., they decrease to 35 mV at the temperature of 75° C. In this case, the differential output signal 7out and the differential output signal 8out are separated by 5 mV, and the differential input signal SIN cannot be detected. In this way, there would be a case that the originally detectable input signal cannot be detected because the peripheral temperature increases.

Typically, the input signal detecting circuit for detecting a very small signal is strongly required to provide a high sensibility and simultaneously avoid erroneous detection. As a result, a detection voltage range, namely, an allowable range of the detection threshold voltage (the amplitude) becomes narrow. For this reason, it is necessary to reduce or remove detection irregularity caused based on peripheral temperature, as mentioned above.

SUMMARY

In an aspect of the present invention, an input signal detecting circuit includes a plurality of comparators configured to output a plurality of differential output signals in response to a differential input signal, respectively; and a differential exclusive OR circuit configured to output an exclusive OR resultant signal from the plurality of differential output signals outputted from the plurality of comparators. In at least one of the plurality of comparators, a DC operation voltage is changed in response to a control signal supplied to the comparator.

In another aspect of the present invention, an input signal detecting circuit includes a first comparator configured to amplify a differential input signal and to output a first differential output signal; a temperature compensating circuit configured to output a control signal with a voltage corresponding to a peripheral temperature; a second comparator configured to amplify the differential input signal by using the control signal and to output a second differential output signal; and a differential exclusive OR circuit configured to output an exclusive OR resultant signal from the first and second differential output signals.

According to the input signal detecting circuit of the present invention, it is possible to detect an input signal of the detection threshold voltage or more without receiving the influence of a peripheral environment. Also, the voltage of the detectable differential input signal can be selected from a plurality of detection threshold voltages.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, an input signal detecting circuit according to embodiments of the present invention will be described in detail with reference to the attached drawings.

First Embodiment

The input signal detecting circuit according to a first embodiment of the present invention will be described below with reference to FIGS. 4 to 9.

Figure 4:
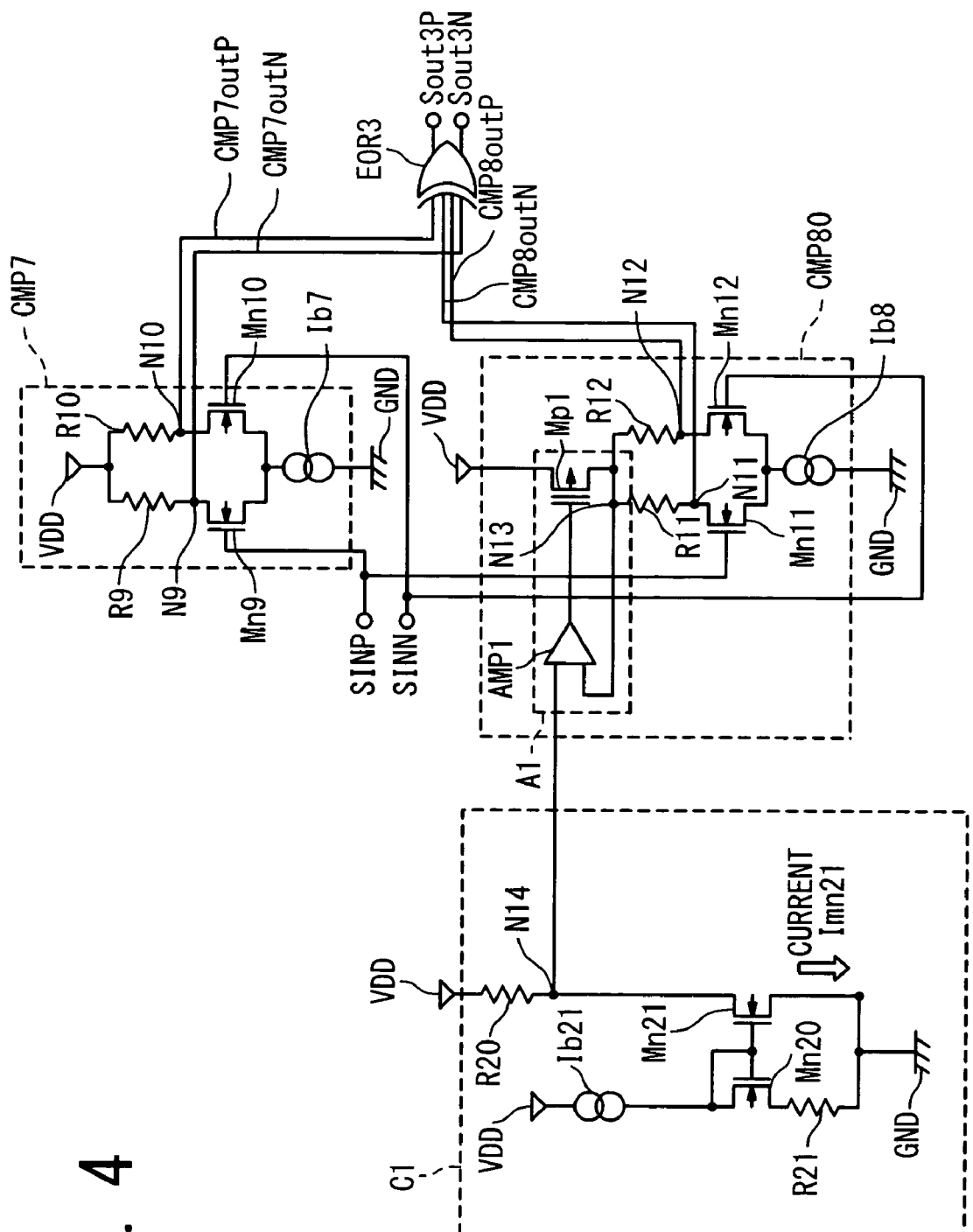
FIG. 4 is a circuit diagram showing a configuration of an input signal detecting circuit according to a first embodiment of the present invention.

FIG. 4 is a circuit diagram showing the configuration of the input signal detecting circuit according to the first embodiment of the present invention. The input signal detecting circuit in the first embodiment is a circuit for detecting the amplitude of a differential input signal SIN, which is composed of an input signal SINP as a positive (normal) phase signal, and an input signal SINN as a negative (opposite) phase signal, and converting the differential input signal SIN into a binary signal.

The input signal detecting circuit according to the first embodiment includes differential comparing circuits CMP7 and CMP80, a differential exclusive OR circuit EOR3 connected to the output ends thereof, and a temperature compensating circuit C1 for controlling an offset voltage Voff1. That is, the input signal detecting circuit according to the first embodiment includes the differential comparing circuit CMP80 instead of the differential comparing circuit CMP8 in the input signal detecting circuit in the conventional example and further includes the temperature compensating circuit C1. Hereinafter, the input signal detecting circuit will be described by assigning the same reference numerals and symbols to same components and signals as those of the conventional example. The differential comparing circuit CMP80 in this embodiment includes an offset adjusting circuit A1, instead of the resistor Rb1 provided to adjust the offset in the conventional example. Also, the temperature compensating circuit C1 outputs a control signal with a voltage Vc corresponding to a peripheral temperature, to the offset adjusting circuit A1 and controls the offset voltage Voff1.

The offset adjusting circuit A1 includes a PMOS transistor Mp1 and an operational amplifier AMP1 and gives the offset voltage Voff1 to a differential output signal CMP8out. The source of the PMOS transistor Mp1 is connected to a power supply voltage VDD, and the drain thereof is commonly connected through a node N13 to one of sets of ends of resistors R11 and R12.

The output terminal of the operational amplifier AMP1 is connected to the gate of the PMOS transistor Mp1, and a negative input terminal is connected to the node N13 between the drain of the PMOS transistor Mp1 and the set of ends of the resistors R11 and R12. Also, the positive input terminal of the operational amplifier AMP1 is connected to the temperature compensating circuit C1 to receive the control signal. A resistance pair of the resistors R11 and R12 and a differential pair of NMOS transistors Mn11 and Mn12 are connected between the node N13 and a grounded potential. Thus, the operational amplifier AMP and the PMOS transistor Mp1 function as a voltage follower. In such configuration, a same voltage as the voltage Vc of the control signal supplied to the positive input terminal from the temperature compensating circuit C1 is supplied to the negative input terminal.

In accordance with the control signal from the temperature compensating circuit C1, a voltage applied between the source and the drain in the PMOS transistor Mp1 is given as the offset voltage Voff1 to the differential output signal CMP8out. Consequently, a DC operation voltage Vo80P (Vo80N) of the differential comparing circuit CMP80 is separated from a DC operation voltage Vo70P (Vo70N) of the differential comparing circuit CMP7 for the offset voltage Voff1. The differential comparing circuits CMP7 and CMP80 output the output signals CMP7outP and CMP8outP whose voltages oscillate by taking to the DC operation voltages Vo70P and Vo80P as centers. Similarly, the differential comparing circuits CMP7 and CMP80 output the output signals CMP7outN and CMP8outN whose voltages oscillate by taking the DC operation voltages Vo70N and Vo80N as centers. Hereinafter, description will be given under the assumption that the DC operation voltage Vo70P and the DC operation voltage Vo70N have a same value, and the DC operation voltage Vo80P and the DC operation voltage Vo80N have a same value.

The input signal detecting circuit according to the first embodiment detects the differential input signal SIN having an amplitude equal to or higher than a predetermined amplitude as the detection threshold amplitude. That is, in the input signal detecting circuit, the amplitude of the differential input signal SIN that can be detected is determined in accordance with the value of the offset voltage Voff1. Thus, the offset voltage Voff1 is required to be set to a voltage corresponding to a desirable detection threshold amplitude. Specifically, the offset voltage Voff1 is set to a voltage equal to the amplitudes of the differential output signals CMP7out and CMP8out outputted on the basis of the differential input signal SIN of the detection threshold amplitude. The offset voltage Voff1 according to the conventional example is a fixed value that is determined in accordance with the resistor Rb. However, the offset voltage Voff1 in the first embodiment is a variable value that is determined by the offset adjusting circuit A1 that is controlled by the temperature compensating circuit C1.

The configuration of the temperature compensating circuit C1 will be described below in detail. The temperature compensating circuit C1 outputs the control signal of the voltage Vc to the offset adjusting circuit A1 and controls the offset voltage Voff1. The temperature compensating circuit C1 contains NMOS transistors Mn20 and Mn21, a constant current source Ib21, and resistors R20 and R21.

One end of the constant current source Ib21 is connected to the power supply voltage VDD, and the other end thereof is connected to the NMOS transistor Mn20. The respective gates of the NMOS transistor Mn20 and the NMOS transistor Mn21 are connected to each other, and form a current mirror circuit. The gate and the drain of the NMOS transistor Mn20 are commonly connected to the other end of the constant current source Ib21, and the source is grounded through the resistor R21. The drain of the NMOS transistor Mn21 is connected through the resistor R20 to the power supply voltage VDD, and the source is grounded. Also, a node N14 between the NMOS transistor Mn21 and the resistor R20 is connected to the positive input terminal of the operational amplifier AMP1. With such configuration, the voltage of the node 14 is outputted as the control signal to the offset adjusting circuit A1.

A current Imn21 flowing through the NMOS transistor Mn21 varies on the basis of the peripheral temperature of the input signal detecting circuit. For this reason, the voltage Vc of the node N14, namely, the control signal varies. Thus, the temperature compensating circuit C1 can output the control signal that is varied on the basis of the peripheral temperature. At this time, the characteristics of the respective elements in the input signal detecting circuit are preferable to be set such that the temperature characteristic of the control signal and the temperature characteristic of the amplitude of the differential output signals CMP7out and CMP8out are equal to each other. Through such a setting, the offset voltage Voff1 varies in accordance with variation of the amplitude of the differential output signals CMP7out and CMP8out dependent on temperature. For this reason, it is possible to prevent the separation between the differential output signal CMP7out and the differential output signal CMP8out, which is caused due to the temperature increase. That is, it is possible to suppress the detection irregularity of the input differential signal, which is caused due to the peripheral temperature.

In the temperature compensating circuit C1 according to the first embodiment, the resistor R21 is connected between the NMOS transistor Mn20 of the current mirror circuit and the ground. For this reason, a voltage Vgs21 between the source and the drain in the NMOS transistor Mn21 is a summation of a voltage generated across the resistor R21 by the constant current Ib21 and a voltage Vgs20 between the source and the drain in the NMOS transistor Mn20 after variation on the basis of the peripheral temperature. Thus, Vgs20≠Vgs21, and the current Imn21 flowing through the NMOS transistor Mn21 is varied on the basis of the temperature. Thus, the voltage Vc across the resistor R20 is similarly varied on the basis of the temperature.

On the other hand, the output voltage of the operational amplifier AMP1 to which the voltage Vc is supplied is varied depending on temperature. In the operational amplifier AMP1, since the output voltage is fed back that is varied on the basis of the temperature, the voltage at the node N13 has a value in which the variation of the operational amplifier AMP dependent on temperature is considered. Therefore, it is preferable that the operational amplifier AMP1 used in the input signal detecting circuit according to the first embodiment has a high open gain, and the output voltage can be varied on the basis of the temperature.

The operation principle of the input signal detecting circuit according to the first embodiment and the characteristics of the respective elements necessary for the input signal detecting circuit will be described below with reference to FIGS. 5 to 9.

At first, the temperature characteristic of the offset voltage Voff1 controlled by the temperature compensating circuit C1 will be described. When the NMOS transistor is in a saturation region, the current flowing through the drain is typically represented by the following equation (11). Here, it is supposed that the drain current flowing through the NMOS transistor is $I_{ds}$, the gate width of the NMOS transistor is W, the gate length is L, a voltage between the gate and the source is Vgs, the threshold voltage is Vt, and a product of the capacitance $C_{ox}$ of the gate oxide film and the carrier mobility $\mu$ is $\beta$.

$$I_{ds} = \frac{1}{2}\beta \frac{W}{L}(V_{gs} - V_t)^2 \quad (11)$$

The product $\beta$ varies on the basis of the temperature. Thus, when ($\beta$W/2L) is defined as a temperature coefficient K, the equation (11) is represented by the following equation (12).

$$I_{ds} = K(V_{gs} - V_t)^2 \quad (12)$$

Hereinafter, in order to simplify the description, it is assumed that the parameters (characteristics) of the NMOS transistors Mn20 and Mn21 are equal to each other and the temperature coefficients K are equal to each other. When a voltage between the gate and the source in the NMOS transistor Mn21 is assumed to be Vgs21, a current Imn21 flowing between the drain and the source in the NMOS transistor Mn21 is represented by the equation (13).

$$Imn21 = K(V_{gs}21 - V_t)^2 \quad (13)$$

When the current flowing through the NMOS transistor Mn20 and the resistor R21 is defined as Ib21, the voltage Vgs21 between the gate and the source in the NMOS transistor Mn21 is represented by the equation (14) (which is equal to a sum of the voltage Vgs20 between the gate and the source in the NMOS transistor Mn20 and a voltage across the resistor R21). Also, when the current Ib21 flows, the voltage Vgs20 between the gate and the source in the NMOS transistor is represented by the equation (15) by using the equation (12). From the equations (13), (14) and (15), the current Imn21 is represented by the following equation (16).

$$V_{gs}21 = I_b21 \times R21 + V_{gs}20 \quad (14)$$

$$V_{gs}20 = \sqrt{\frac{Ib21}{K}} + Vt \quad (15)$$

$$Imn21 = Ib21^2 \times R21^2 \times K + 2 \times Ib21 \times R21 \times \sqrt{Ib21 \times K} + Ib21 \quad (16)$$

The equation (16) indicates the current Imn21 with respect to the constant current Ib21. The temperature coefficient K includes the product $\beta$ that is varied on the basis of the temperature. Thus, when the equation (16) is differentiated with respect to the temperature coefficient K, the variation amount in the current Imn21 in association with the temperature change can be determined. When the equation (16) is differentiated with respect to the temperature coefficient K, the equation (17) is obtained:

$$\frac{Imn21}{K} = Ib21^2 \times R21^2 + 2 \times Ib21 \times R21 \times \sqrt{Ib21} \times \frac{1}{2\sqrt{K}} \quad (17)$$

Figure 5:
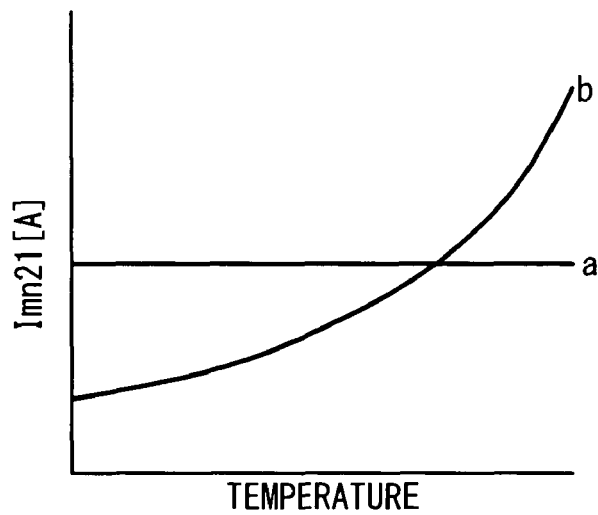
FIG. 5 is a view showing a temperature characteristic of a current Imn in a temperature compensating circuit according to the present invention.

In the equation (17), the second item on the right side indicates a variation amount of the current Imn21 corresponding to the temperature change. It should be noted that the actual variation amount of the current Imn21 depends on the structure of the NMOS transistor and a technique for manufacturing it. FIG. 5 is a temperature characteristic diagram showing a relation between current Imn21 and temperature. With reference to FIG. 5, a curve a indicates the temperature characteristic of the current Imn21 when the resistor R21 has 0Ω, and a curve b indicates the temperature characteristic of the current Imn21 in this embodiment (the resistor R21≠0). With reference to the equation (17) and FIG. 5, since there is the resistor R21, the current Imn21 according to the first embodiment is increased with the increase in the temperature. It should be noted that the curve a indicates the characteristic of the typical current mirror circuit.

The current Imn21 flows through the resistor R20. Thus, the voltage Vc at the node N14 is represented by the following equation (18) when the power supply voltage is assumed to be VDD and the resistance of the resistor R20 is assumed to be R20.

$$Vc = VDD - Imn21 \times R20 \quad (18)$$

Figure 6:
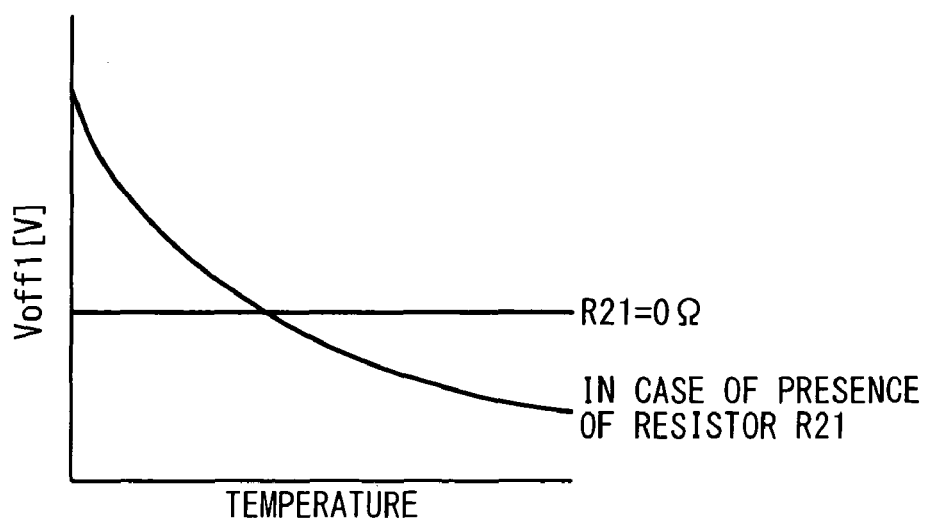
FIG. 6 is a view showing a temperature characteristic of an offset voltage according to the present invention.

The voltage Vc is supplied as the control signal to the positive input terminal of the operational amplifier AMP1. Since the operational amplifier AMP1 and the PMOS transistor Mp1 constitute the voltage follower circuit, the voltage Vc also appears at the negative input terminal of the operational amplifier AMP1. That is, the offset voltage Voff1 as a voltage between the drain and the source in the PMOS transistor Mp1 becomes equal to the voltage Vc. FIG. 6 shows the temperature characteristic diagram showing a relation between the offset voltage Voff1 and the temperature. As mentioned above, since the current Imn21 increases with the temperature increase, the offset voltage Voff1 decreases with the temperature increase (FIG. 6 and the equation (18)).

Next, the temperature characteristic of the amplitudes of the differential output signals CMP7out and CMP8out will be described below. In order to simplify the description, it is assumed that the NMOS transistors Mn9, Mn10, Mn11 and Mn12 are the transistors having the same characteristics and the resistors R10, R11 and R12 are the resistors having the same characteristic. In this case, the absolute values of the voltages of the output signals CMP7outP, CMP7outN, CMP8outP and CMP8outN become |CMP7outP|=|CMP7outN|=|CMP8outP|=|CMP8outN|.

However, the voltages of the output signals CMP7outP, CMP7outN, CMP8outP and CMP8outN are assumed to be CMP7outP, CMP7outN, CMP8outP and CMP8outN, respectively. Since the differential output signal CMP8out is similar to the differential output signal CMP7out, only the differential output signal CMP7out will be described hereinafter. When the voltages of the input signals SINP and SINN are assumed to be SINP and SINN, respectively, voltage increase rates of the differential input signal SIN and the differential output signal CMP7out in the differential comparing circuit CMP7 are represented by the equation (9). Moreover, when the equation (2) is substituted into the transfer conductance gm of the equation (9), the equation (19) is obtained. However, under the assumption that the input signals SINP and SINN have the same voltage, |SINP|=|SINN|=SIN, and the amplitude of the differential output signal CMP7out is defined as CMP7out=CMP7outP−CMP7outN.

$$\frac{CMP7out}{SIN} = \sqrt{\frac{K \times Ids}{2} \times R9} \qquad (19)$$

Figure 7:
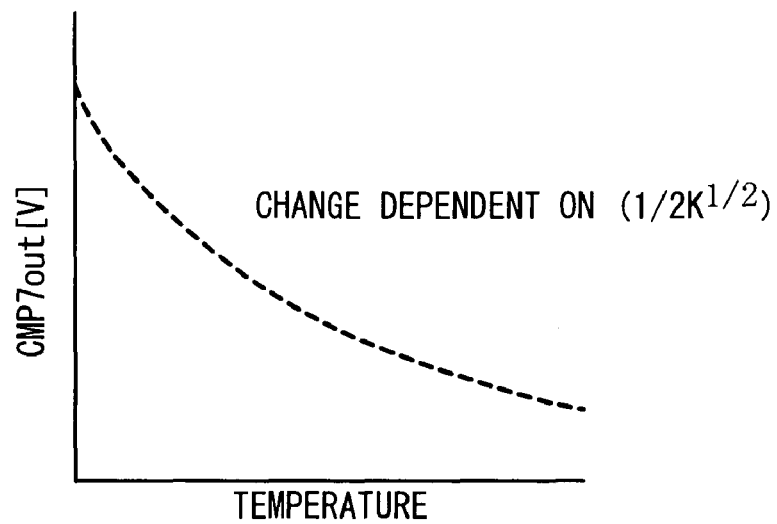
FIG. 7 is a view showing a temperature characteristic of an amplitude of a differential output signal according to the present invention.

When the equation (19) is differentiated with respect to the temperature coefficient K, and a variation amount of the amplitude of the differential output signal CMP7out with respect to the temperature change is determined, the equation (20) is obtained. Thus, as shown in FIG. 7, the amplitudes of the differential output signals CMP7out and CMP8out decrease with the increase in the peripheral temperature.

$$\frac{\delta CMP7out}{K} = SIN \times R9 \times \frac{1}{2\sqrt{K}} \qquad (20)$$

As mentioned above, with reference to the equations (9), (18) and (20), both of a variation amount of the offset voltage Voff1 (the voltage Vc at the node N14) dependent on temperature and a variation amount of the amplitudes of the differential output signals CMP7out and CMP8out dependent on temperature are determined on the basis of (½)K$^{1/2}$. In the first embodiment, the offset voltage Voff1 is required to be varied on the basis of the temperature, so as to follow the variations in the differential output signals CMP7out and CMP8out dependent on temperature. For this reason, it is preferable that the variation amount of the offset voltage Voff1 dependent on temperature and the variation amount of the amplitudes of the differential output signals CMP7out and CMP8out dependent on temperature are equal to each other. In order to attain such a condition, the equation (21) is obtained from the equations (17) and (20).

$$SIN \times R9 \times \frac{1}{2\sqrt{K}} = \qquad (21)$$
$$Ib21^2 \times R21^2 + 2 \times Ib21 \times R21 \times \sqrt{Ib21} \times \frac{1}{2\sqrt{K}}$$

Therefore, in the first embodiment, it is preferable that the constant current source Ib21, the resistor R9 and the resistor R21 are selected to meet the equation (21). However, the resistors R9, R10, R11 and R12 are equal in resistance value, and the resistors R20, R21 are equal in resistance value. Also, in the NMOS transistors Mn9, Mn10, Mn11 and Mn12, Mn20 and Mn21 and the PMOS transistor Mp1, it is preferable that MOS transistors having the temperature coefficients K (the gate width W, the gate length L, the gate oxide film capacitance $C_{ox}$ and the carrier mobility μ) are selected to meet the equation (21). Through a combination of such elements, the variation of the amplitudes of the differential output signals CMP7out and CMP8out dependent on the peripheral temperatures in the differential comparing circuits CMP7 and CMP8 and the variation of the offset voltage Voff1 dependent on the peripheral temperature in the temperature compensating circuit C1 become equal to each other.

Figure 8:
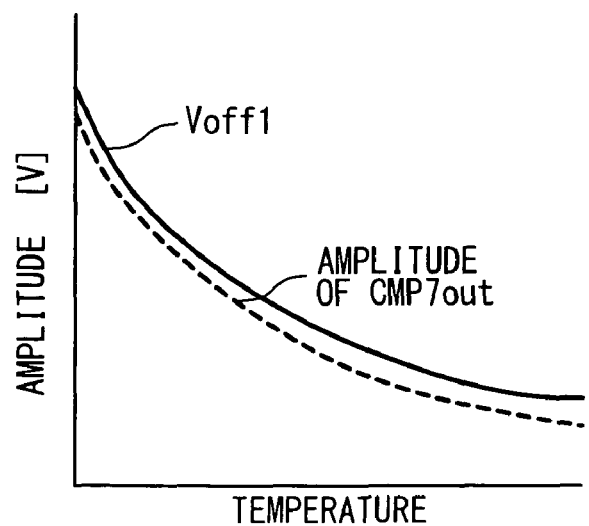
FIG. 8 is a view showing a comparison between the temperature characteristics of the amplitude and offset voltage of the differential output signal according to the present invention.
Figure 9A:
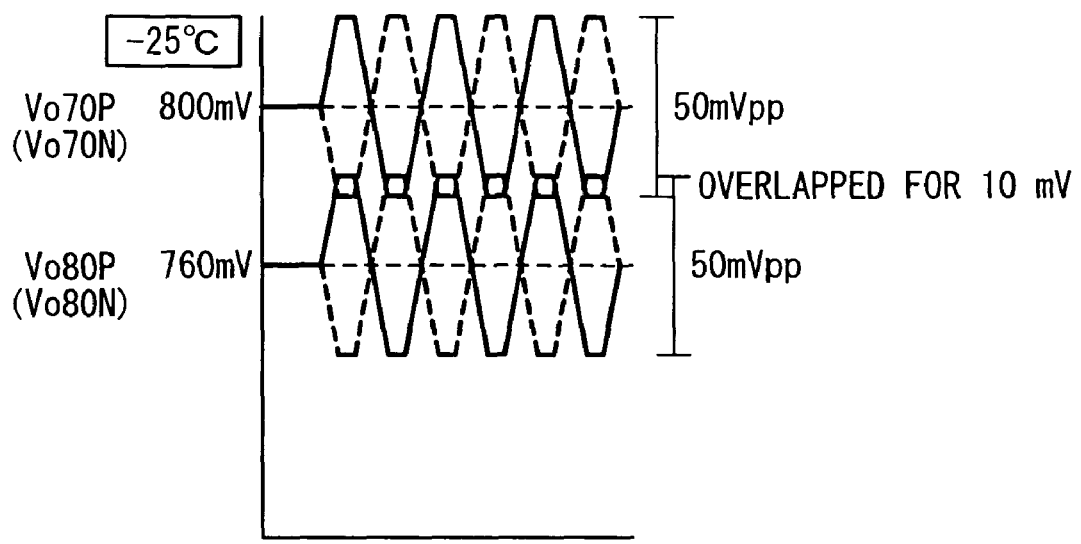
FIGS. 9A and 9B are examples showing a signal detection result in temperature variation in the input signal detecting circuit according to the present invention.
Figure 9B:
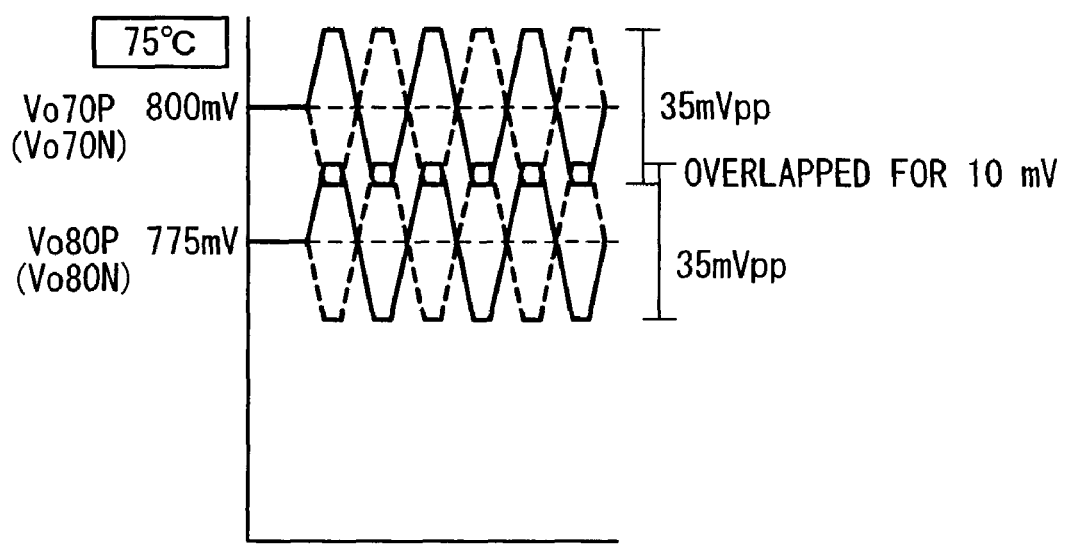

FIG. 8 shows a relation of the amplitude of the differential output signal CMP7out (CMP8out) in the input signal detecting circuit configured to meet the equation (21) and the temperature characteristic of the offset voltage Voff1. The amplitudes of the differential output signals CMP7out and CMP8out are decreased with the increase in the peripheral temperature, so that the offset voltage Voff1 is also decreased by the variation amount for the decrease in the amplitudes.

Figure 1:
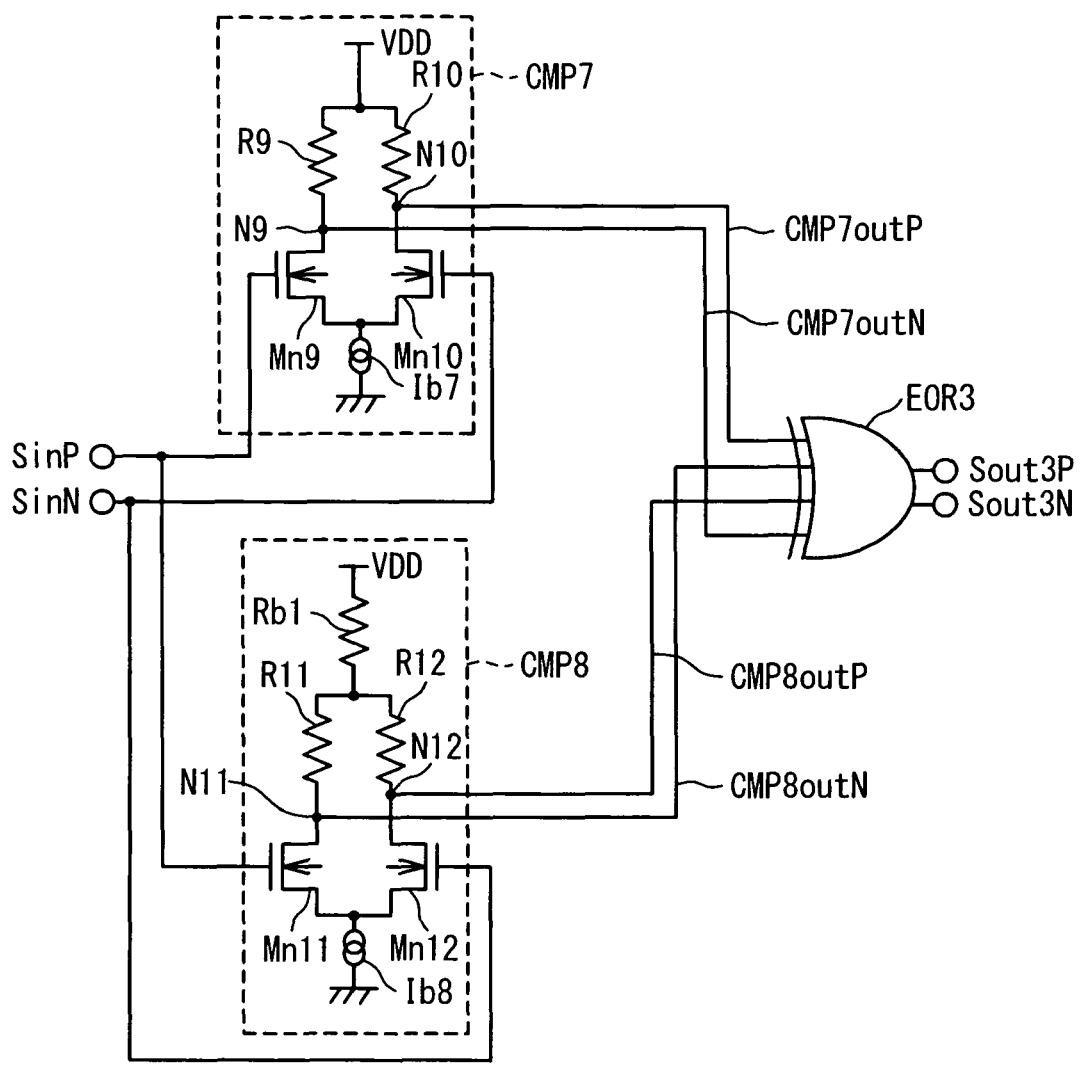
FIG. 1 is a configuration view of an input signal detecting circuit according to a conventional example.
Figure 2A:
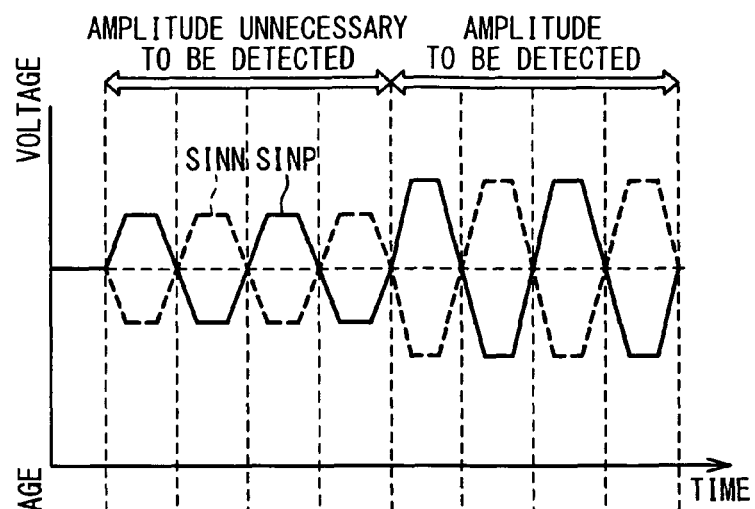
FIGS. 2A to 2C are timing charts showing an input signal detecting operation of the input signal detecting circuit.
Figure 2B:
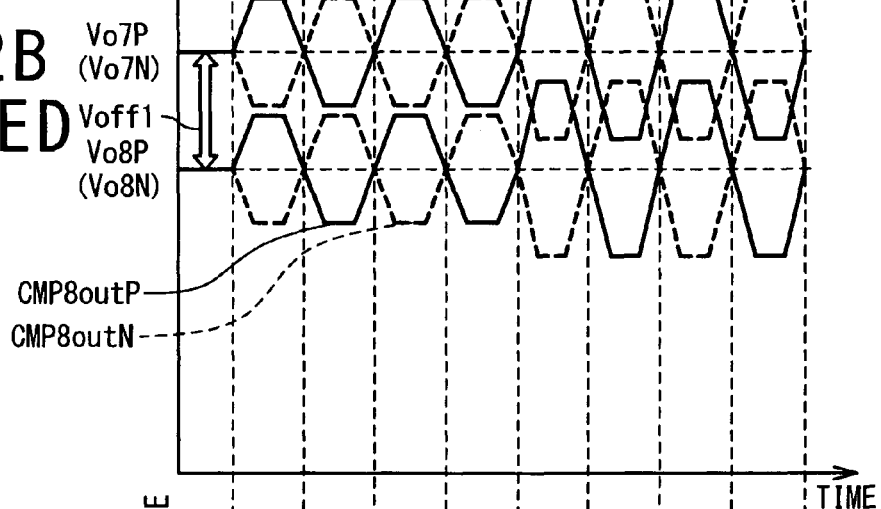
Figure 2C:
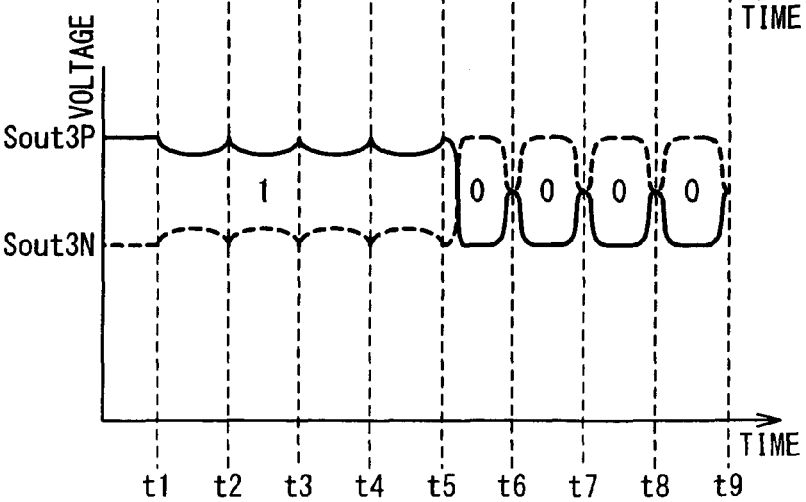
Figure 3A:
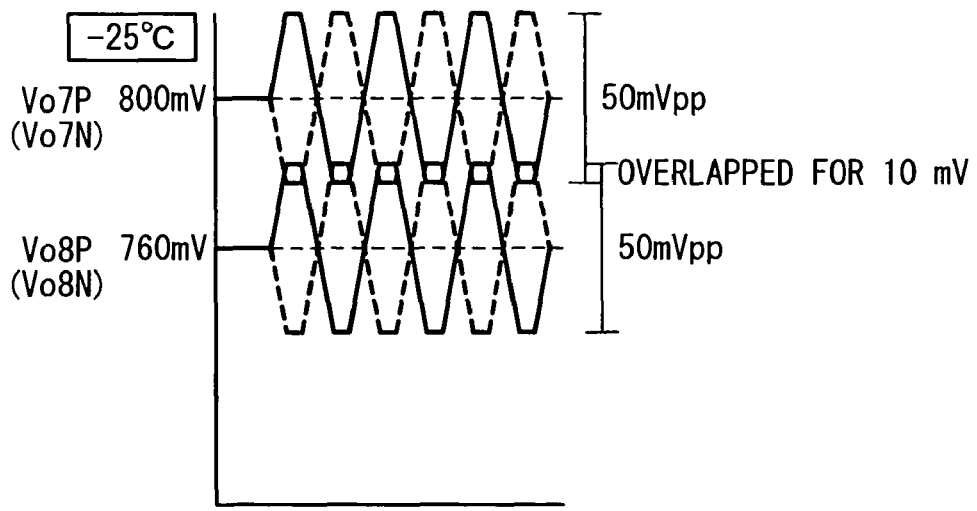
FIGS. 3A and 3B are examples showing a signal detection result in temperature variation in the input signal detecting circuit according to the conventional example.
Figure 3B:
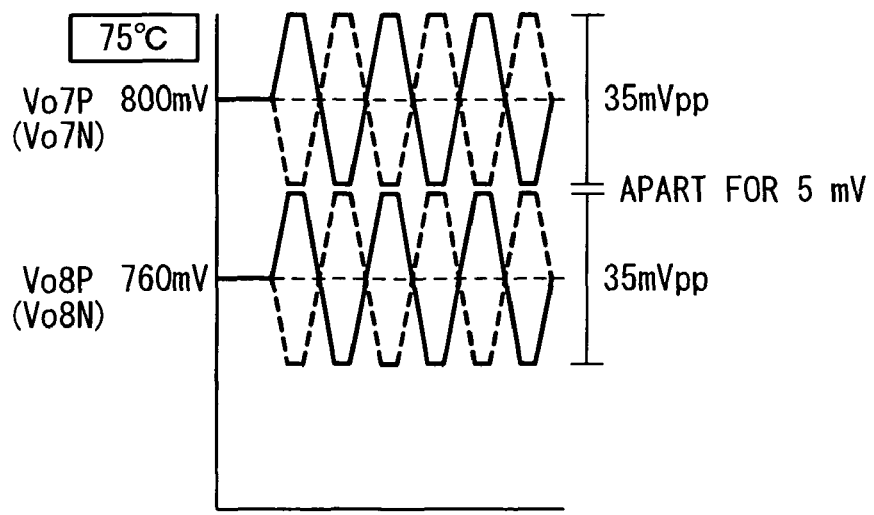

FIGS. 3A and 3B are waveform diagrams showing the waveforms of the differential output signals 7out and 8out when the differential input signal SIN having the detectable amplitude is supplied to the input signal detecting circuit according to the first embodiment. FIGS. 3a and 3B show the waveforms when the peripheral temperature is low (−25° C.) and high (75° C.)

In response to the control signal from the temperature compensating circuit C1, a voltage difference for the offset voltage Voff1 is generated between the DC operation voltage Vo70P (Vo70N) of the differential comparing circuit CMP7 and the DC operation voltage Vo80P (Vo80N) of the differential comparing circuit CMP80. When the peripheral temperature is −25° C., the offset voltage Voff1 is 40 mV, and the DC operation voltage Vo70P (Vo70N) is 800 mV, and the DC operation voltage Vo80P (Vo80N) is 760 mV. Also, when the peripheral temperature is −25° C., both of the amplitudes (the maximum amplitudes) of the differential output signals CMP7 and CMP80 are 50 mV. On the other hand, when the peripheral temperature is 75° C., the offset voltage Voff1 is decreased to 25 mV by 15 mV, and the DC operation voltage Vo70P (Vo70N) becomes 800 mV, and the DC operation voltage Vo80P (Vo80N) becomes 775 mV. Also, when the peripheral temperature is 75° C., both of the amplitudes (the maximum amplitudes) of the differential output signals CMP7 and CMP80 are 35 mV, and they are decreased by 15 mV as compared with a case of −25° C. That is, in association with the increase in the peripheral temperature, the amplitude of the differential output signal and the offset voltage are decreased by the same variation amount. In other words, the temperature characteristics of the amplitudes of the differential output signals CMP7 and CMP8 and the temperature characteristic of the offset voltage Voff1 exhibit an inversely proportional relation. Thus, the differential output signals CMP7 and CMP80 are not separated unlike the conventional example, even if the temperature is increased, and they exhibit the overlapping of a certain amount (here, 10 mV). Therefore, according to the first embodiment, it is possible to detect the input differential signal SIN having the desirable amplitude without any influence of the peripheral temperature.

Second Embodiment

Figure 10:
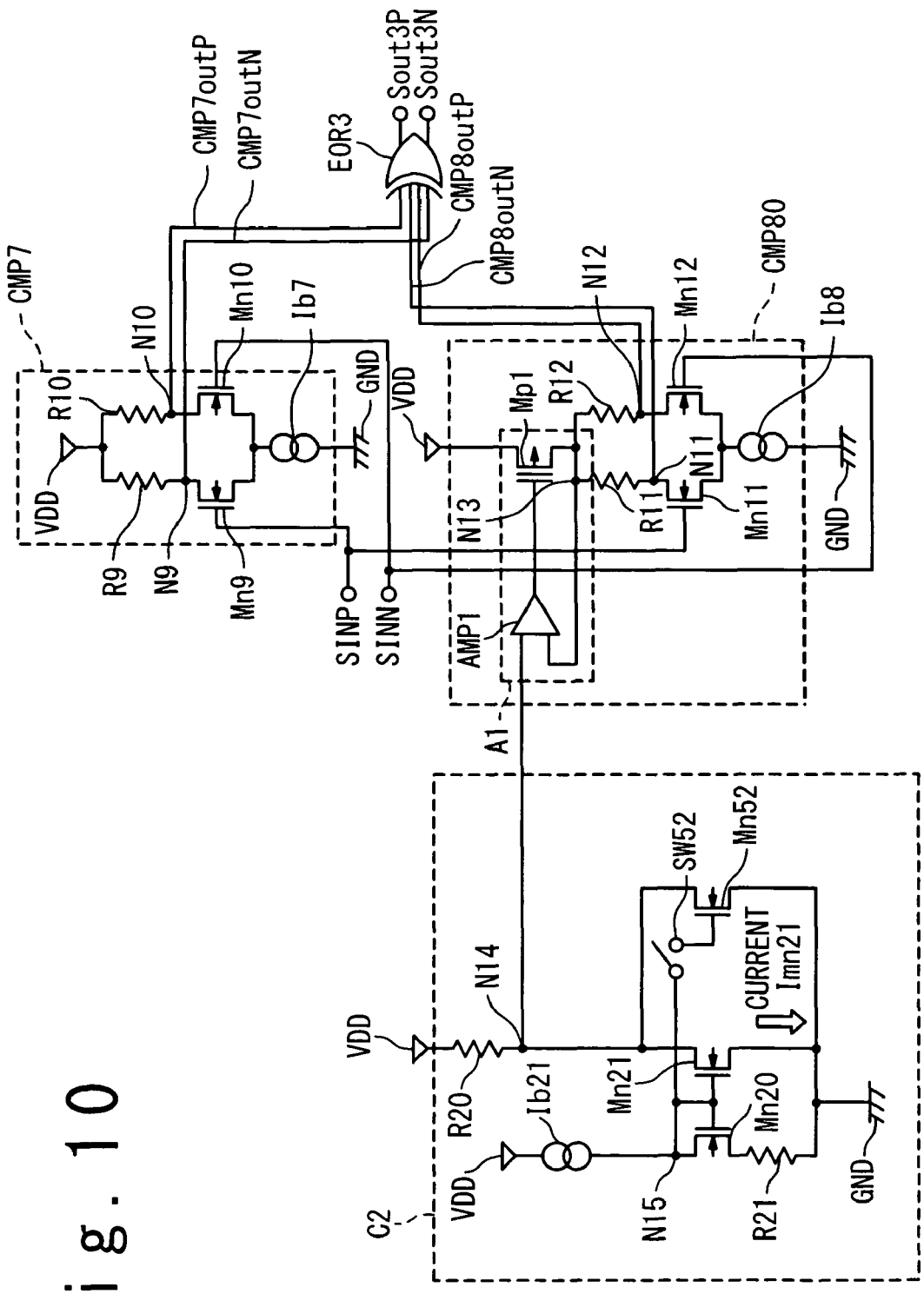
FIG. 10 is a circuit diagram showing a configuration of the input signal detecting circuit according to a second embodiment of the present invention.

The input signal detecting circuit according to a second embodiment of the present invention will be described below with reference to FIG. 10. FIG. 10 is a circuit diagram showing the configuration of the input signal detecting circuit in the second embodiment. The input signal detecting circuit in the second embodiment includes a switching circuit SW52 for switching the value of the control signal, instead of the temperature compensating circuit C1 of the input signal detecting circuit in the first embodiment. The other components are similar to those of the first embodiment. Thus, a temperature compensating circuit C2 will be described below.

The temperature compensating circuit C2 contains an NMOS transistor Mn52 and the switching circuit SW52, in addition to the temperature compensating circuit C1 in the first embodiment. The switching circuit SW52 has two terminals, and one end thereof is connected to the gate of the NMOS transistor Mn52, and the other end is connected through a node N15 to the gate of the NMOS transistor Mn21 and the gate and drain of the NMOS transistor Mn20 and the constant current source Ib21. The drain of the NMOS transistor Mn52 is connected through the node N14 and the resistor 20 to the power supply voltage VDD, and the source is grounded. Also, the gate of the NMOS transistor Mn52 is connected through the switching circuit SW52 to the node N15 (the gate and drain of the Mn20 and the constant current source Ib21).

The operation of the temperature compensating circuit C2 will be described below. When the switching circuit SW52 is in the OFF state, the temperature compensating circuit C2 carries out the same operation as the temperature compensating circuit C1 in the first embodiment. When the switching circuit SW52 is in the ON state, the NMOS transistors Mn20, MN21 and MN52 form a current mirror circuit. At this time, the voltage Vc of the node N14 indicates a value different from the voltage Vc when the switching circuit SW52 is in the OFF state. That is, the input signal detecting circuit in the second embodiment can switch the voltage value of the offset voltage Voff1 to a different value by the switching circuit SW52. In the first embodiment, as a limit value (the detection threshold voltage) of the amplitude of the differential input signal SIN that can be detected by the input signal detecting circuit, only one is set. However, in the second embodiment, a desirable detection threshold voltage can be selected and used from the two kinds of the detection threshold voltages. It should be noted that the second embodiment has the configuration in which one set of the switching circuit SW52 and the NMOS transistor Mn52 is added to the temperature compensating circuit C1. However, the configuration may be used in which under the similar connection, a plurality of sets of switches and MOS transistors are added to the temperature compensating circuit C1. In such a case, in the input signal detecting circuit, the desirable detection threshold voltage can be selected from the plurality of detection threshold voltages.

The operation principle of the input signal detecting circuit when the switching circuit SW52 is in the ON state will be described below.

In the temperature compensating circuit C2, when the NMOS transistors Mn21 and Mn52 are same in structure and in size, and the switching circuit SW52 is in the ON state, it is equivalent to the configuration in which the gate width of the NMOS transistor Mn21 in the first embodiment is doubled. As mentioned above, the temperature coefficient K is proportional to the gate width. Thus, when the switching circuit SW52 is turned ON, the temperature coefficient K is made doubled as compared with the OFF case. That is, when the switching circuit SW52 is set to the ON state, the temperature compensating circuit C2 exhibits the configuration and operation that are equivalent those of the first embodiment, but the temperature coefficient K has a value determined by the NMOS transistors Mn21 and MN54 (here, two times that of the OFF state).

With reference to the equation (16), the current Imn21 is increased with the increase in the temperature coefficient K. Thus, in accordance with the equation (18), the voltage Vc of the node 14 is decreased with the increase in the temperature coefficient K. That is, when the switching circuit SW52 is turned ON, the offset voltage Voff1 has a value smaller than that of the OFF state. For this reason, the input signal detecting circuit in the second embodiment can detect the differential input signal SIN having the amplitude smaller than that of the OFF state, by turning ON the switching circuit SW52.

When the switching circuit SW52 is turned ON, as mentioned above, the temperature compensating circuit C2 becomes equivalent to that of the first embodiment although the temperature coefficient K is different. Thus, as described in the first embodiment, the variation amount dependent on temperature of the control signal (the voltage Vc=the offset voltage Voff1) outputted by the temperature compensating circuit C2 and the variation amount dependent on temperature of the differential output signals CMP7out and CMP8out are equal to each other. For this reason, even when the switching circuit SW52 is turned ON, the offset voltage Voff1 varies, following the variation dependent on temperatures of the differential output signals CMP7out and CMP8out. Thus, it is possible to suppress the detection irregularity dependent on temperature.

As mentioned above, the input signal detecting circuit in the second embodiment can select the desirable detection threshold voltage from the plurality of detection threshold voltages through the switching circuit SW52.

As mentioned above, the embodiments of the present invention have been described in detail. However, the specific configuration is not limited to the above-mentioned embodiments. Even the change in the range without departing from the scope and spirit of the present invention is included in the present invention. In the first and second embodiments, the differential comparing circuit using the NMOS transistors has been described. However, the differential comparing circuit using the PMOS transistors may be used. In this case, the offset adjusting circuit A1 contains the PMOS transistor, instead of the PMOS transistor Mp1. Moreover, the NMOS transistor in the temperature compensating circuit C1 (C2) may be the PMOS transistor.

What is claimed is:

1. An input signal detecting circuit comprising:
   a plurality of comparators configured to output a plurality of differential output signals in response to a differential input signal, respectively; and
   a differential exclusive OR circuit configured to output an exclusive OR resultant signal from the plurality of differential output signals outputted from said plurality of comparators,
   wherein, in at least one of said plurality of comparators, a DC (direct current) operation voltage is changed in response to a control signal supplied to said at least one of said plurality of comparators according to at least an ambient variable comprising a peripheral temperature of the input signal detecting circuit.

2. The input signal detecting circuit according to claim 1, further comprising:
   a temperature compensating circuit configured to output said control signal from a voltage value corresponding to peripheral temperature,
   wherein said plurality of comparators comprises:
   a first comparator configured to amplify said differential input signal and output a first differential output signal as one of the plurality of differential output signals; and
   a second comparator configured to amplify said differential input signal and output a second differential output signal as one of the plurality of differential output signals,
   wherein said second comparator comprises:
   an offset adjusting circuit configured to include an offset voltage with a voltage value determined in response to said control signal to said second comparator, and
   said differential exclusive OR circuit outputs the exclusive OR resultant signal of a differential signal of a positive phase signal of said first differential output signal and an opposite phase signal of said second differential output signal and a differential signal of a positive phase signal of said second differential output signal and an opposite phase signal of said first differential output signal.

3. The input signal detecting circuit according to claim 2, wherein each of temperature characteristics of an amplitude of said first differential output signal and an amplitude of said second differential output signal is inversely proportion to a temperature characteristic of the voltage value of said control signal.

4. The input signal detecting circuit according to claim 2, wherein said first comparator comprises:
a first differential pair of two transistors which are connected with a first constant current source in common; and
a first load resistance pair of load resistors which is connected with said first differential pair through a first node pair from which the said first differential output signal is outputted,
said second comparator comprises:
a second differential pair of two transistors which are connected with a second constant current source in common; and
a second load resistance pair of load resistors which is connected with said second differential pair through a second node pair from which said second differential output signal is outputted,
said second load resistance pair is connected with a power supply through said offset adjusting circuit, and
said offset adjusting circuit controls current which flows through load resistances of said second load resistance pair of load resistors, in response to said control signal supplied from said temperature compensating circuit.

5. The input signal detecting circuit according to claim 4, wherein said temperature compensating circuit comprises a current mirror circuit,
said current mirror circuit comprises a first transistor and a second transistor whose gates are mutually connected to each other,
said first transistor is provided between a third constant current source and a first resistance connected to a ground,
said second transistor is provided between a second resistance connected with said power supply and the ground, and
said temperature compensating circuit outputs said control signal from a connection node between said second transistor and said second resistance to said offset adjusting circuit.

6. The input signal detecting circuit according to claim 4, wherein said offset adjusting circuit comprises a voltage follower circuit of a third transistor and an operational amplifier,
said third transistor is provided between said power supply and said second load resistance pair, and
said operational amplifier has a first input terminal connected with said temperature compensating circuit, a second input terminal connected with a node between said second load resistance pair and said third transistor, and an output terminal connected with a gate of said third transistor.

7. The input signal detecting circuit according to claim 6, wherein said first and second transistors are N-channel MOS transistors, and
said third transistor comprises a P-channel MOS transistor.

8. The input signal detecting circuit according to claim 6, wherein said first and second transistors comprise P-channel MOS transistors, and said third transistor comprises an N-channel MOS transistor.

9. The input signal detecting circuit according to claim 2, wherein said temperature compensating circuit further comprises:
a switch circuit configured to select said control signal as one of a plurality of signals.

10. The input signal detecting circuit according to claim 5, wherein said temperature compensating circuit further comprises:
a fourth transistor having a drain connected with said connection node and a source connected with the drain of said second transistor; and
a switch circuit provided between a drain of said first transistor and a gate of said fourth transistor.

11. The input signal detecting circuit according to claim 10, wherein a conductive type of said fourth transistor is same as those of said first and said second transistors.

12. The input signal detecting circuit according to claim 1, further comprising:
a temperature compensating circuit configured to output said control signal from a voltage value corresponding to the ambient variable comprising the peripheral temperature,
wherein said at least one of said plurality of comparators comprises an offset adjusting circuit providing an offset voltage with a voltage value determined in response to said control signal to said at least one of said plurality of comparators.

13. The input signal detecting circuit according to claim 1, further comprising an ambient variable compensating circuit configured to output said control signal from a voltage value corresponding to the ambient variable comprising the peripheral temperature.

14. An input signal detecting circuit comprising:
a first comparator configured to amplify a differential input signal and to output a first differential output signal;
a temperature compensating circuit configured to output a control signal with a voltage corresponding to a peripheral temperature;
a second comparator configured to amplify said differential input signal by using the control signal and to output a second differential output signal; and
a differential exclusive OR circuit configured to output an exclusive OR resultant signal from said first and second differential output signals.

15. The input signal detecting circuit according to claim 14, wherein in at least one of said plurality of comparators, a DC operation voltage is varied in response to said control signal.

16. The input signal detecting circuit according to claim 14, wherein said second comparator comprises:
an offset adjusting circuit configured to give an offset voltage with the voltage determined in response to said control signal, to said second differential output signal.

17. The input signal detecting circuit according to claim 14, wherein said differential exclusive OR circuit outputs the exclusive OR resultant signal of a differential signal of a positive phase signal of said first differential output signal and an opposite phase signal of said second differential output signal and a differential signal of a positive phase signal of said second differential output signal and an opposite phase signal of said first differential output signal.

18. The input signal detecting circuit according to claim 14, wherein said temperature compensating circuit further comprises:
a switch circuit configured to select said control signal as one of a plurality of signals.

19. An input signal detecting circuit comprising:
a plurality of comparators amplifying a differential input signal and outputting a plurality of differential output signals;
a compensating circuit configured to output a control signal with a voltage corresponding to a determined variable to compensate a separation among outputs of the plurality of differential output signals; and
a differential logic circuit configured to output a resultant signal from the plurality of differential output signals according to the control signal.

20. The input signal detecting circuit according to claim 19, wherein:
the differential logic circuit comprises a XOR (exclusive OR) gate to output an exclusive OR resultant signal from said plurality of differential output signals; and
the compensating circuit outputting the control signal with the voltage corresponding to the determined variable comprising a peripheral temperature.

* * * * *